(12) United States Patent
Lee et al.

(10) Patent No.: US 6,607,984 B1
(45) Date of Patent: Aug. 19, 2003

(54) REMOVABLE INORGANIC ANTI-REFLECTION COATING PROCESS

(75) Inventors: Gill Yong Lee, Wappingers Falls, NY (US); Scott D. Halle, Hopewell Junction, NY (US); Jochen Beintner, Wappingers Falls, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 0 days.

(21) Appl. No.: 09/597,122

(22) Filed: Jun. 20, 2000

(51) Int. Cl.[7] .................. H01L 21/302; H01L 21/3065
(52) U.S. Cl. .................. 438/700; 438/723; 438/724
(58) Field of Search .................. 438/700, 723, 438/724

(56) References Cited

U.S. PATENT DOCUMENTS

| | | | |
|---|---|---|---|
| 5,030,588 A | * 7/1991 | Hosaka | 438/384 |
| 5,512,499 A | * 4/1996 | Cambou et al. | 438/179 |
| 5,747,388 A | 5/1998 | Küsters et al. | 438/723 |
| 5,766,692 A | * 6/1998 | Lee et al. | 427/443.2 |
| 5,783,842 A | * 7/1998 | Kohchi et al. | 257/59 |
| 5,807,784 A | 9/1998 | Kim | 438/423 |
| 5,883,006 A | * 3/1999 | Iba | 438/712 |
| 5,883,011 A | 3/1999 | Lin et al. | 438/747 |
| 6,159,832 A | * 12/2000 | Song et al. | 438/437 |
| 6,171,973 B1 | * 1/2001 | Schiavone et al. | 438/719 |

FOREIGN PATENT DOCUMENTS

| | | |
|---|---|---|
| EP | 0 908 937 A2 | 4/1999 |
| EP | 0 932 187 A2 | 7/1999 |
| JP | 62286229 | 12/1987 |
| JP | 9055351 | 2/1997 |
| WO | WO 99/10918 | 3/1999 |
| WO | WO 01/26142 A1 | 4/2001 |

OTHER PUBLICATIONS

Nesbit et al. et al., A 0.6 $\mu m2$ 256 Mb Trench DRAM Cell With Self-Aligned Buried Strap (BEST), IEDM 1993, pp. 627–630.*

* cited by examiner

Primary Examiner—Benjamin L. Utech
Assistant Examiner—Lynette T. Umez-Eronini
(74) Attorney, Agent, or Firm—Slater & Matsil, L.L.P.

(57) ABSTRACT

In accordance with the present invention, a method for employing and removing inorganic anti-reflection coatings, includes the steps of providing a first dielectric layer on a semiconductor device structure to be processed, the first dielectric layer being selectively removable relative to the semiconductor device structure, and forming an inorganic dielectric anti-reflection coating (DARC) on the first dielectric layer, the DARC being selectively removable relative to the first dielectric layer. A resist layer is patterned on the DARC. The resist is selectively removable relative to the DARC. The semiconductor device structure is etched, and the resist layer, the DARC and the first dielectric layer are selectively removed.

22 Claims, 8 Drawing Sheets

REMOVABLE INORGANIC ANTI-REFLECTION COATING PROCESS

BACKGROUND

1. Technical Field

This disclosure relates to semiconductor fabrication and more particularly, to a method for applying and removing an inorganic anti-reflection coating for semiconductors.

2. Description of the Related Art

Anti-reflection coatings (ARCs) are typically deposited in semiconductor fabrication prior to the deposition of a resist material. ARC coatings absorb radiation to form an optical opaque film which enhances the optical contrast of the imaging resist. ARC coatings effectively reduce reflection (anti-reflection) of the incident radiation back into the overlying resist layer. This prevents overexposure of the resist material.

Dielectric anti-reflection coatings (DARCs) have become more attractive for deep ultraviolet (DUV) lithographic ARC applications. It may be desirable for DARCs to replace organic ARC processes in semiconductor industry depending on the application of the coating. DARC processes have many advantages over organic ARC processes. Both the thickness and the chemical composition of the DARC can be optimized to minimize optical reflections from an underlying film stack to provide lithographic control of feature sizes. DARC can provide higher dry etch selectivity to DUV resist in mask open processes for at least two reasons. One, the DARC layer may be substantially thinner than organic ARC. Second, the etch selectivity of DARC to resist can be optimized to be greater than one, whereas organic ARC selectivity to resists is usually limited to less than or equal to one. Additionally, since the DARC thickness can be precisely controlled, DARC, DARC have the potential for better critical dimension control during the ARC open processes.

However, DARC is not usable for some applications because it is difficult to remove DARC after a lithographic process. DARC is more difficult to remove relative to removing an organic ARC or a resist. For example, when DARC is used on the top of a silicon nitride layer such as for processing at an active area (AA) level of a semiconductor device, it is extremely difficult to eliminate DARC without nitride loss because DARC is very similar to nitride in terms of its chemical composition.

Organic ARC layers tend to be thick since they are etched at about a same rate as the resist layer deposited thereon. Typically, organic ARC layers tend to be about 900 Å to about 1100 Å in thickness. This thickness is not desirable since the thickness may adversely affect dimension control for patterning structures in the semiconductor device.

Therefore, a need exists for a for a method for forming a DARC layer and removing the DARC layer in semiconductor fabrication processes. A further need exists for a thinner anti-reflection layer with higher selectivity to resist.

SUMMARY OF THE INVENTION

In accordance with the present invention, a method for employing and removing inorganic anti-reflection coatings, includes the steps of providing a first dielectric layer on a semiconductor device structure to be processed, the first dielectric layer being selectively removable relative to the semiconductor device structure, and forming an inorganic dielectric anti-reflection coating (DARC) on the first dielectric layer, the DARC being selectively removable relative to the first dielectric layer. A resist layer is patterned on the DARC. The resist is selectively removable relative to the DARC. The semiconductor device structure is etched, and the resist layer, the DARC and the first dielectric layer are selectively removed.

A method for etching an active area, in accordance with the invention includes providing a substrate having deep trenches formed therein and a pad stack formed thereon, the trenches including storage nodes and buried straps formed in the trenches. A first dielectric layer is provided on the pad stack, on sidewalls of the trenches and over the buried straps. The first dielectric layer is selectively removable relative to the pad stack, the sidewalls of the trenches and the buried straps. An inorganic dielectric anti-reflection coating (DARC) is formed on the first dielectric layer. The DARC is selectively removable relative to the first dielectric layer. A resist layer is patterned on the DARC, and the resist is selectively removable relative to the DARC. Positions are etched for shallow trench isolation regions in accordance with the patterned resist layer. The resist layer, the DARC and the first dielectric layer are selectively removed.

In other methods, the step of providing a first dielectric layer may include the step of forming a conformal first dielectric layer. The method may include the step of forming an overhang structure with the first dielectric layer to prevent at least some coverage of vertical surfaces by the DARC. The first dielectric layer may include a silicon oxide or a polymer. The step of forming an inorganic dielectric anti-reflection coating (DARC) on the first dielectric layer may include the step of forming the DARC including a silicon oxynitride. The step of forming an inorganic dielectric anti-reflection coating (DARC) on the first dielectric layer may include the step of annealing the DARC to prevent interactions between the resist layer and the DARC. The step of forming an inorganic dielectric anti-reflection coating (DARC) on the first dielectric layer may also include the step of depositing the DARC by one of a chemical vapor deposition process and a physical vapor deposition process. The method may include the step of forming a second dielectric layer on the DARC, the second dielectric layer being selectively removable relative to the DARC.

A method for employing inorganic anti-reflection coatings, in accordance with the present invention, includes providing a first dielectric layer on a semiconductor device structure to be processed, the first dielectric layer being selectively removable relative to the semiconductor device structure, and forming an inorganic dielectric anti-reflection coating (DARC) on the first dielectric layer, the DARC being selectively removable relative to the first dielectric layer. A resist layer is patterned on the DARC, the resist being selectively removable relative to the DARC. A portion of the DARC and the first dielectric layer are etched in accordance with resist layer. The resist layer is selectively removed with respect to the DARC, and the semiconductor device structure is etched by employing the DARC as a hard mask.

In other methods, the step of selectively removing the DARC and the first dielectric layer is included. The step of etching the semiconductor device structure by employing the DARC as a hard mask may include the step of consuming the DARC during the etching of the semiconductor device structure. The first dielectric layer may include a silicon oxide. The step of forming an inorganic dielectric anti-reflection coating (DARC) on the first dielectric layer may include the step of annealing the DARC to prevent interactions between the resist layer and the DARC. The step of forming an inorganic dielectric anti-reflection coating (DARC) on the first dielectric layer may include the step of forming the DARC with silicon oxynitride.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention includes methods for forming and removing inorganic anti-reflection layers in semiconductor fabrication processes. The present invention provides a thin anti-reflection layer which is formed on a layer or sandwiched between two layers to improve etch selectivity and the ability to remove the anti-reflection layer when processing is complete. In addition, the anti-reflection layer formed in accordance with the present invention may be employed as a hard mask for etching underlying layers.

Figure 1:
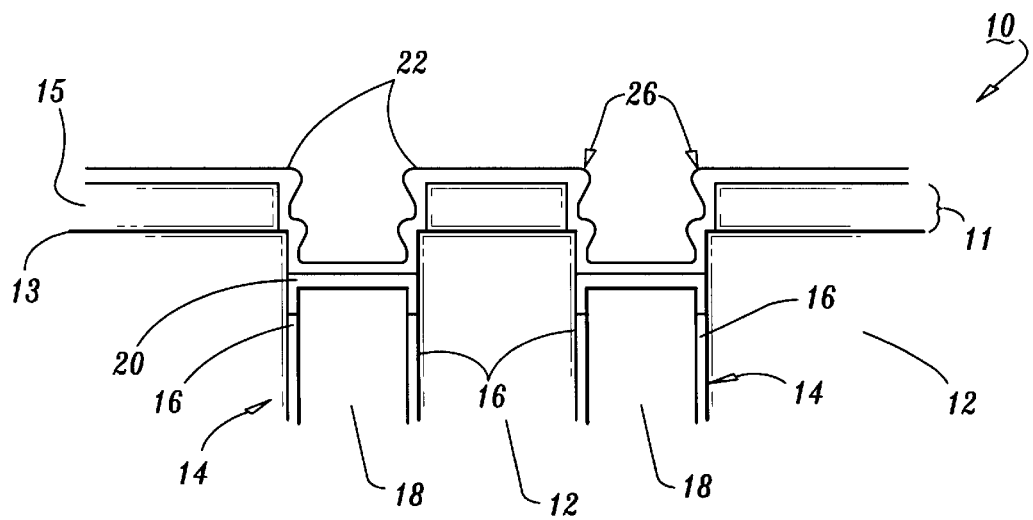
FIG. 1 is a cross-sectional view of a semiconductor chip employing deep trench capacitor technology and showing a dielectric layer deposited with overhangs in accordance with the present invention.
Figure 2:
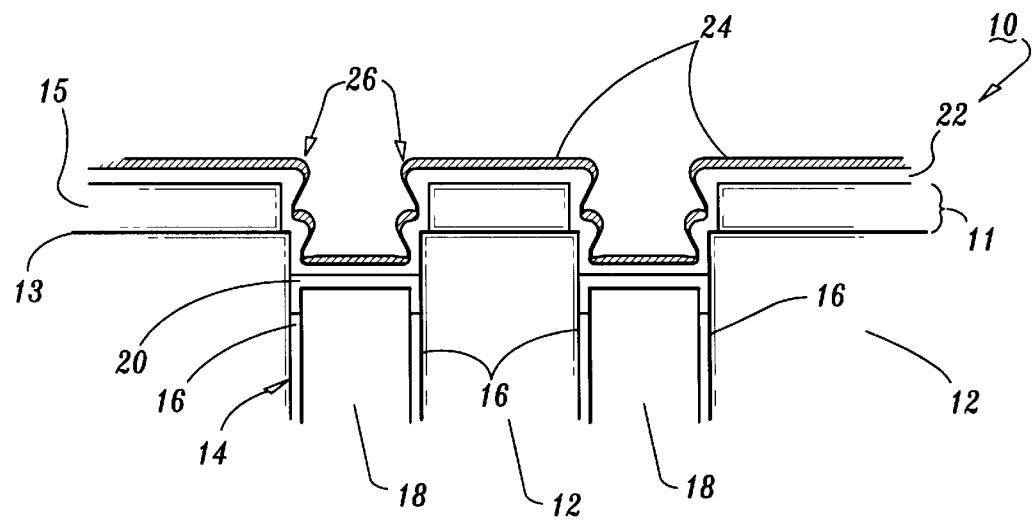
FIG. 2 is a cross-sectional view of the semiconductor chip of FIG. 1 showing an inorganic dielectric anti-reflection coating (DARC) formed thereon in accordance with the present invention.

Referring now in specific detail to the drawings in which like reference numerals identify similar or identical elements throughout the several views, and initially to FIGS. 1 and 2, cross-sectional views of a semiconductor chip 10 are shown. Semiconductor chip 10 may include a memory device such as, a dynamic random access memory (DRAM), a synchronous DRAM (SDRAM), static RAM or other memory device. Semiconductor chip 10 may include a processor, embedded DRAM, application specific integrated circuit chip (ASIC) or any other device which employs an anti-reflection coating (ARC) in conjunction with a resist layer.

Semiconductor chip 10 of FIG. 1 illustratively shows a semiconductor memory employing deep trench capacitor technology. Semiconductor chip 10 includes a substrate 12 which may be a monocrystalline silicon substrate, however, other materials may be employed, for example gallium arsenide, silicon on insulator, etc. A pad stack 11 is formed on substrate 12. Pad stack 11 preferably includes a thermal oxide layer 13 and a pad nitride layer 15. Deep trenches 14 have been formed in substrate 12 by methods known to those skilled in the art. An oxide collar 16 has been formed in trenches 14, and trenches 14 have been filled with polysilicon or equivalent conductive material to form a storage node 18 for the trench capacitor. A buried strap 20 is formed over the polysilicon of storage node 18. Buried strap 20 also preferably includes polysilicon or equivalent.

In accordance with the present invention, the following non-limiting method is illustratively performed for an active area etch which is employed to form shallow trench isolation trenches in the active area of the chip 10. A conformal layer 22 is formed over a surface of chip 10. Conformal layer 22 may be employed when fewer differences in topography exist. In preferred embodiments, layer 22 may include an oxide such as, plasma enhance silane chemical vapor deposited oxide, a glass, for example, boro-phospho silicate glass (BPSG), a polymer or an anti-reflection coating (ARC), for example, BARL. Other materials may be used which are selectively etchable relative to an inorganic anti-reflection layer 24 (FIG. 2). Inorganic anti-reflection layer 24 includes a light absorbing material, such as oxynitride, for example $Si_xO_yN_z$. Other materials may be employed for layer 24 as well. Layer 24 is deposited with a thickness of less than about 900 Å and preferably less than about 800 Å.

In a preferred embodiment, layer 24 is deposited on conformal layer 22 in such a way as to limit step coverage. This may be performed by depositing layer 22, which may be comprised of a silicon oxide, using $SiH_4$ and $N_2O$ at a low temperature and low power to provide an overhang structure 26. Advantageously, layer 24, which is preferably silicon oxynitride ($Si_xO_yN_z$) covers all top surfaces of components on chip 10, and about 60–80% or more coverage of vertical surfaces. This minimizes the step coverage of layer 24. By forming layer 22 as described a poor quality $SiO_2$ layer is formed which is easily removable selective to pad stack 11 and substrate 12. Layer 24 is selectively removable relative to layer 22.

Layer 24 may be deposited using a chemical vapor deposition (CVD) or physical vapor deposition (PVD) process. For a silicon oxynitride dielectric anti-reflection coating, a CVD process may be employed. Other processes are contemplated as well. In a preferred embodiment, layer 24 is annealed to eliminate possible interactions between a resist layer (deposited in later steps, see FIG. 4) and exposed portions of layer 24.

Figure 3:
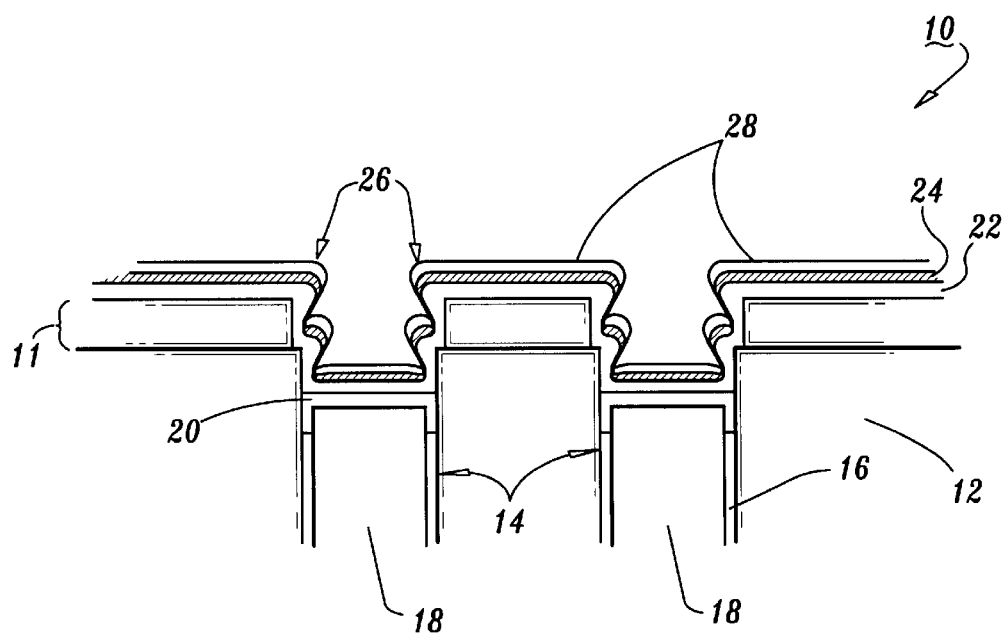
FIG. 3 is a cross-sectional view of the semiconductor chip of FIG. 2 showing another dielectric formed on the DARC to form a sandwich structure in accordance with the present invention.

Referring to FIG. 3, an optional dielectric layer 28 is formed on layer 24. Layer 28 is preferably an oxide, such as silicon oxide; other materials may also be used which are selectively removable relative to layer 24. Layer 28 covers layer 24 and enables a resist layer to be formed on layer 28 and removed selective to layer 28. Dielectric layer 28 is employed as an interface between layer 24 and a resist layer to be patterned as described below. Dielectric layer 28 is employed when contact between layer 24 and resist layer 30 (FIG. 4) negatively impacts lithographic performance (e.g., due to poisoning of the resist). In this case, resist layer 30 (FIG. 4) is shown patterned on dielectric layer 28.

Figure 4:
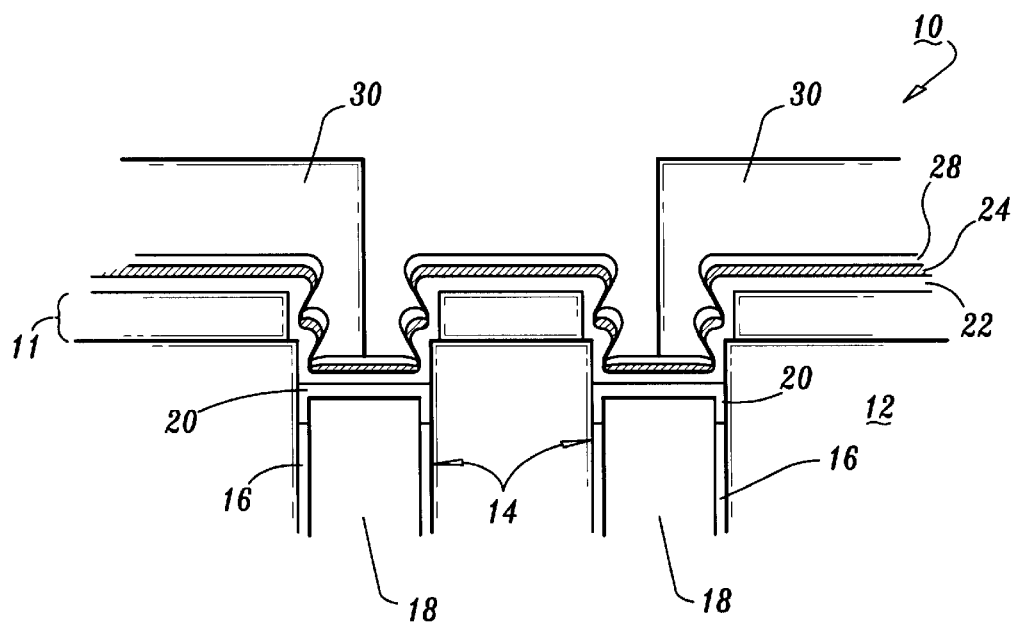
FIG. 4 is a cross-sectional view of the semiconductor chip of FIG. 3 showing a resist patterned in accordance with the present invention.

Referring to FIG. 4, a resist layer 30 is deposited, exposed and patterned by lithographic techniques known to those skilled in the art. During exposure, layer 24 functions as an anti-reflection layer. Layer 24 is preferably an inorganic DARC layer which provides improved characteristics during exposure time of resist layer 30. Layer 24 is capable of absorbing ultraviolet (UV) radiation such as deep UV (DUV) while providing, better lithographic critical dimension control, higher dry etch selectivity to DUV resists, better etch critical dimension control during ARC open processes, lower manufacturing costs, good thickness uniformity, etc. Etching is now performed.

Figure 5:
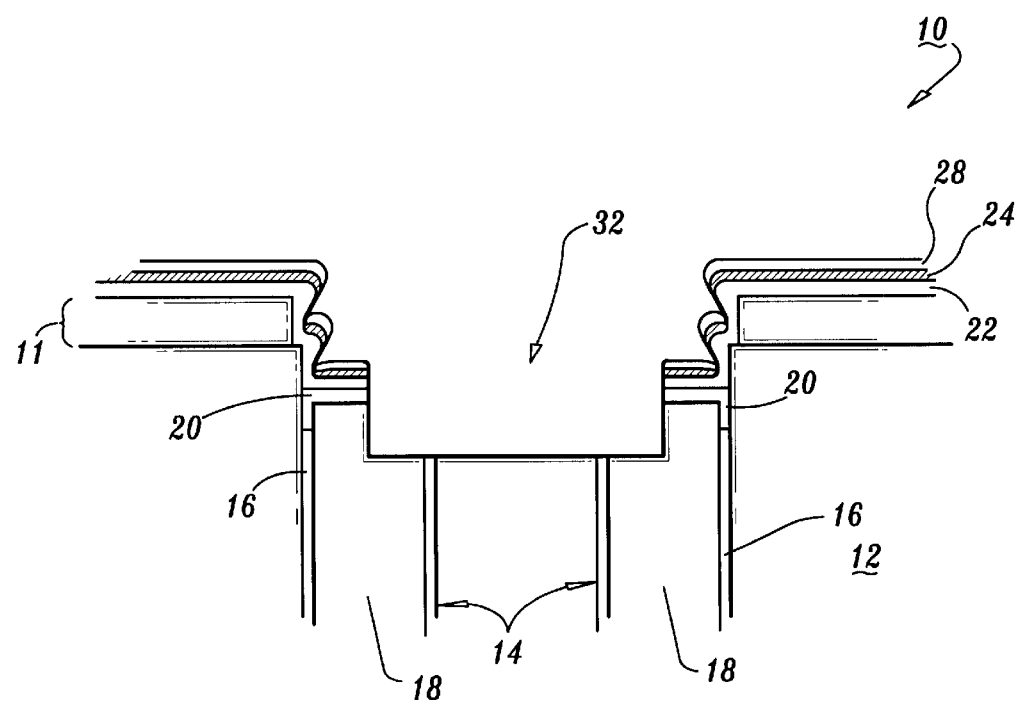
FIG. 5 is a cross-sectional view of the semiconductor chip of FIG. 4 showing a shallow trench isolation (STI) position formed in accordance with the present invention.

Referring to FIG. 5, a shallow trench isolation position or shallow trench 32 is formed in chip 10 by the active area etching. Resist layer 30 is now removed selective to layer 28 (or layer 24) in accordance with the invention.

Figure 6:
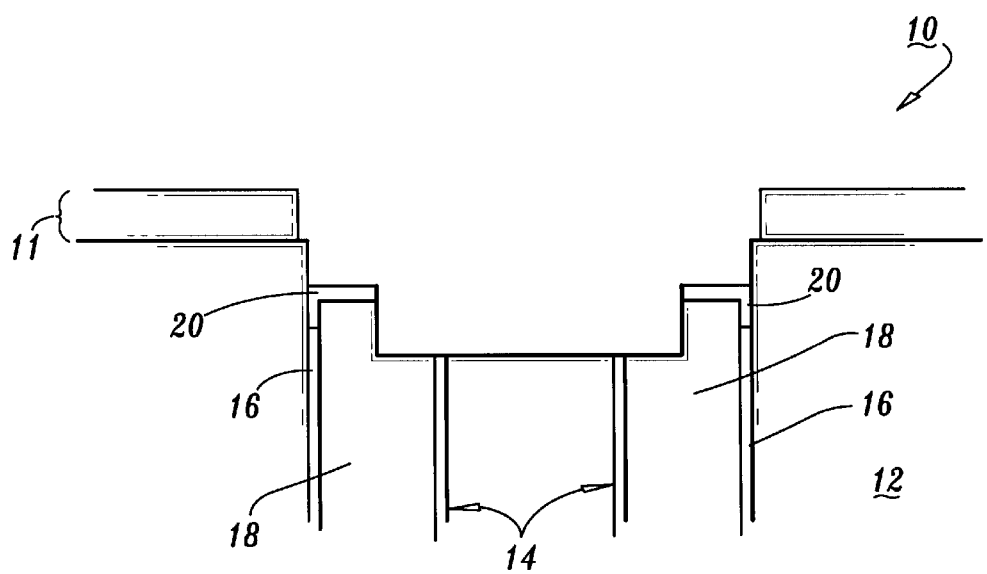
FIG. 6 is a cross-sectional view of the semiconductor chip of FIG. 5 showing the sandwich structure selectively removed in accordance with the present invention.

Referring to FIG. 6, layer 28, if employed, may now be removed selective to layer 24 by employing a wet and/or a dry etching process. Otherwise, layer 24 is advantageously removed selective to layer 22 by a wet and/or a dry etching process in accordance with the invention. Layer 22 is removed selective to pad stack 11, collar 16, storage node 18, and substrate 12 by a wet and/or a dry etching process. Processing may now continue to complete the semiconductor structures.

Figure 7:
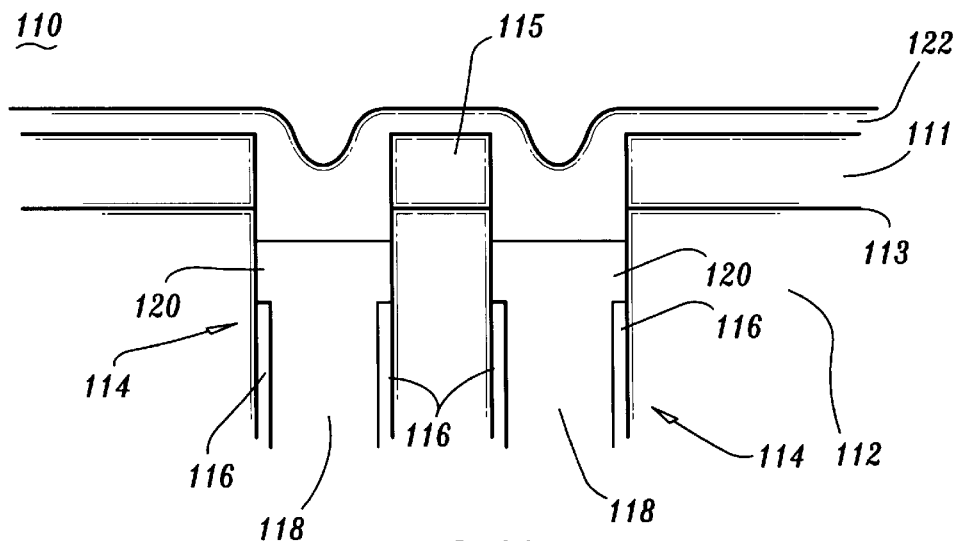
FIG. 7 is a cross-sectional view of a semiconductor chip employing deep trench capacitor technology and showing a dielectric layer non-conformally deposited in accordance with the present invention.

Referring to FIG. 7, a semiconductor chip 110 illustratively shows a semiconductor memory employing deep trench capacitor technology. Semiconductor chip 110 includes a substrate 112 which may be a monocrystalline silicon substrate, however, other materials may be employed, for example gallium arsenide, silicon on insulator, etc. A pad stack 111 is formed on substrate 112. Pad stack 111 preferably includes a thermal oxide layer 113 and a pad nitride layer 115. Deep trenches 114 have been formed in substrate 112 by methods known to those skilled in the art. An oxide collar 116 has been formed in trenches 114, and trenches 114 have been filled with polysilicon or equivalent conductive material to form a storage node 118 for the trench capacitor. A buried strap 120 is formed over the polysilicon of storage node 118. Buried strap 120 also preferably includes polysilicon or equivalent.

In accordance with the present invention, the following non-limiting method is illustratively performed for an active area etch which is employed to form shallow trench isolation trenches in the active area of the chip 110. A non-conformal layer 122 is formed over a surface of chip 110. Non-conformal layer 122 may be employed when a greater number of differences in topography exist. In preferred embodiments, layer 122 may include an oxide such as, plasma enhance silane chemical vapor deposited oxide, a glass, for example, boro-phospho silicate glass (BPSG), a polymer or an anti-reflection coating (ARC), such as, for example BARL. Other materials may be used which are selectively etchable relative to an inorganic anti-reflection layer 124 (FIG. 8).

Figure 8:
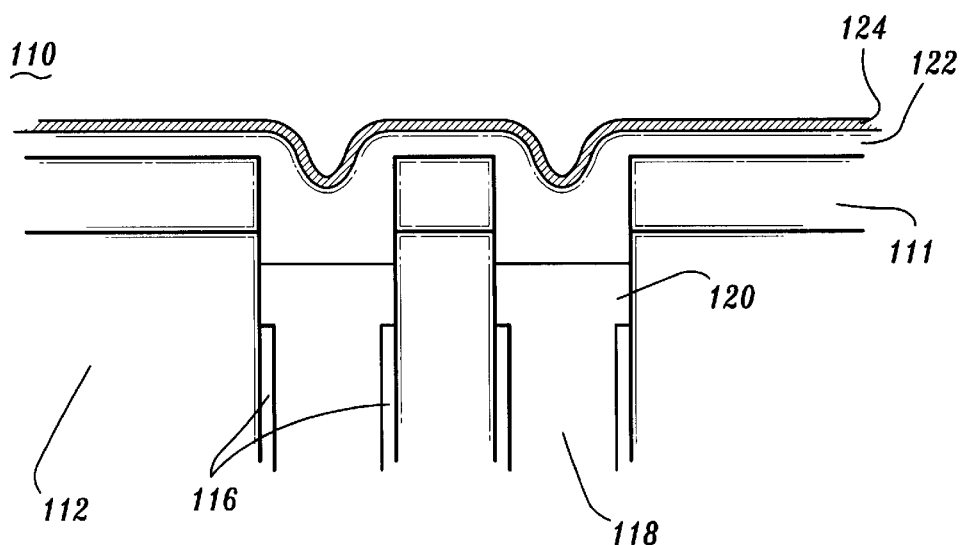
FIG. 8 is a cross-sectional view of the semiconductor chip of FIG. 7 showing an inorganic dielectric anti-reflection coating (DARC) formed thereon in accordance with the present invention.

Referring to FIG. 8, inorganic anti-reflection layer 124 includes a light absorbing material, such as oxynitride, for example $Si_xO_yN_z$. Other materials may be employed for layer 124 as well. Layer 124 is deposited with a thickness of less than about 900 Å and preferably less than about 800 Å.

Layer 122 is easily removable selective to pad stack 11 and substrate 112. Layer 124 is selectively removable relative to layer 122. Layer 124 may be deposited using a chemical vapor deposition (CVD) or physical vapor deposition (PVD) process. For a silicon oxynitride dielectric anti-reflection coating, a CVD process may be employed. Other processes are contemplated as well.

In a preferred embodiment, layer 124 is annealed to eliminate possible interactions between a resist layer (deposited in later steps, see FIG. 9) and exposed portions of layer 124. Alternately, a dielectric layer may be deposited on layer 124 to prevent interactions as described above.

Figure 9:
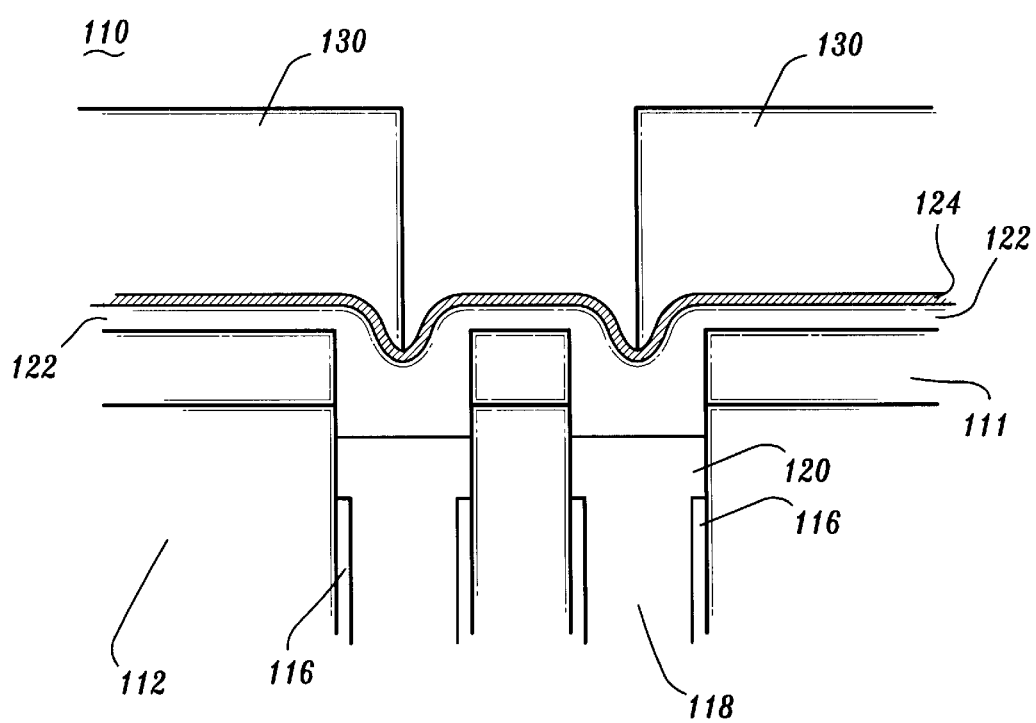
FIG. 9 is a cross-sectional view of the semiconductor chip of FIG. 8 showing a resist patterned in accordance with the present invention.

Referring to FIG. 9, a resist layer 130 is deposited, exposed and patterned by lithographic techniques known to those skilled in the art. During exposure, layer 124 functions as an anti-reflection layer. Layer 124 is preferably an inorganic DARC layer which provides improved characteristics during exposure time of resist layer 130. Layer 124 is capable of absorbing ultraviolet (UV) radiation such as deep UV (DUV) while providing, better lithographic critical dimension control, higher dry etch selectivity to DUV resists, better etch critical dimension control during ARC open processes, lower manufacturing costs, good thickness uniformity, etc. Etching is now performed.

Figure 10:
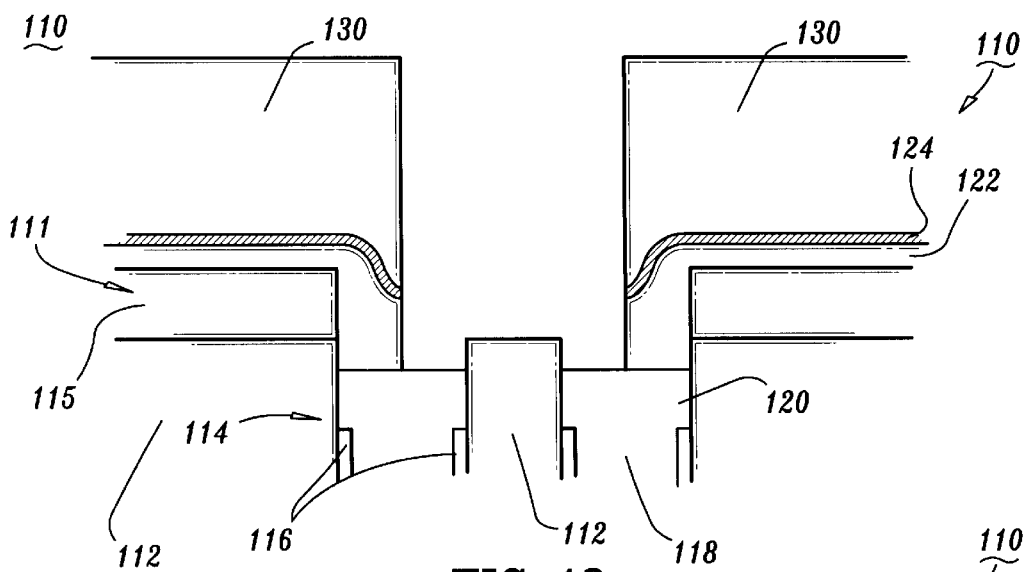
FIG. 10 is a cross-sectional view of the semiconductor chip of FIG. 9 showing the DARC and the dielectric layer removed according to the patterned resist in accordance with the present invention.

Referring to FIG. 10, a portion of layer 124 is selectively removed relative to layer 122. Advantageously, the removal of DARC of layer 124 in accordance with the present invention is easily performed. Layer 122 and pad nitride 115 are also removed in accordance with the pattern of resist layer 130. In one embodiment, resist layer 130 is employed to further etch a position 132 (FIG. 12) for a trench such as an STI position.

Figure 11:
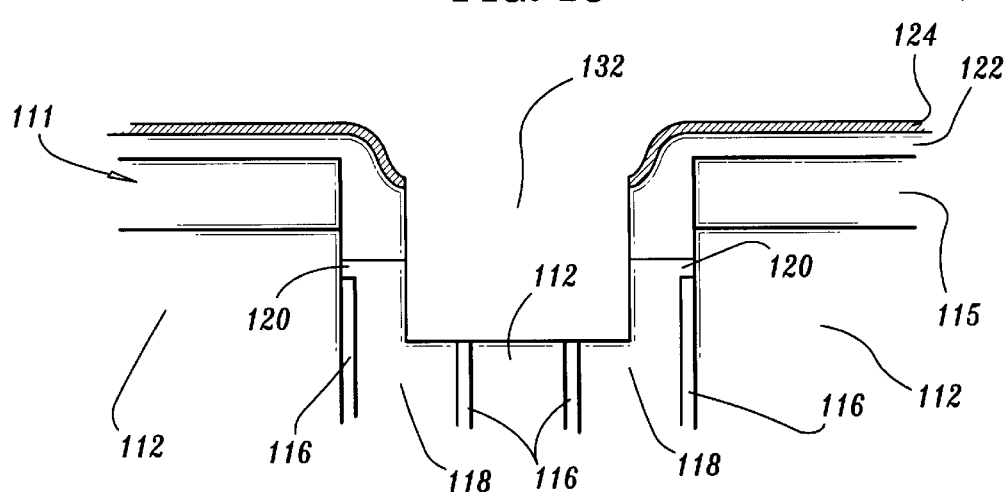
FIG. 11 is a cross-sectional view of the semiconductor chip of FIG. 10 showing a shallow trench isolation (STI) position formed in accordance with the present invention.

Referring to FIG. 11, in an alternate embodiment, resist layer is removed and layer 124 is employed as a hard mask to further etch position 132.

Figure 12:
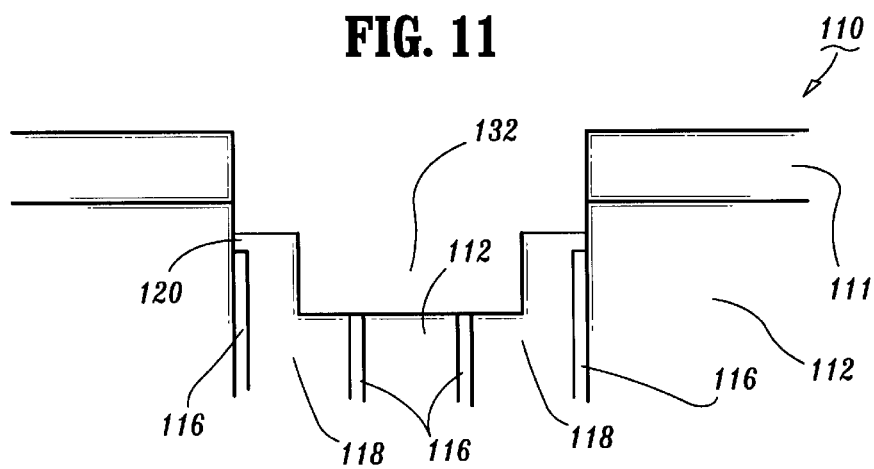
FIG. 12 is a cross-sectional view of the semiconductor chip of FIG. 11 showing the DARC and dielectric layer selectively removed in accordance with the present invention.

Referring to FIG. 12, a shallow trench isolation position or shallow trench 132 is formed in chip 110 by the active area etching. Resist layer 130 is now removed selective to layer 124 in accordance with the invention. Layer 124 is removed selective to layer 122 by a wet and/or a dry etching process. Layer 122 is removed selective to pad stack 111, collar 116, storage node 118, and substrate 112 by a wet and/or a dry etching process. Processing may now continue to complete the semiconductor structures.

Figure 13:
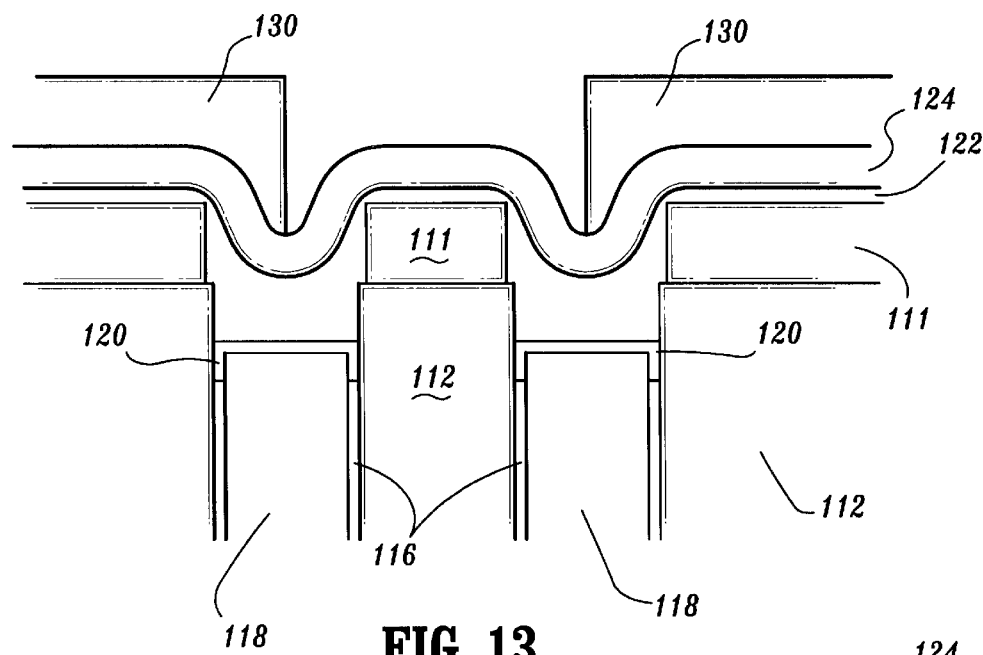
FIG. 13 is a cross-sectional view of a semiconductor chip with a dielectric layer and a DARC to be patterned using a resist layer in accordance with the present invention.
Figure 14:
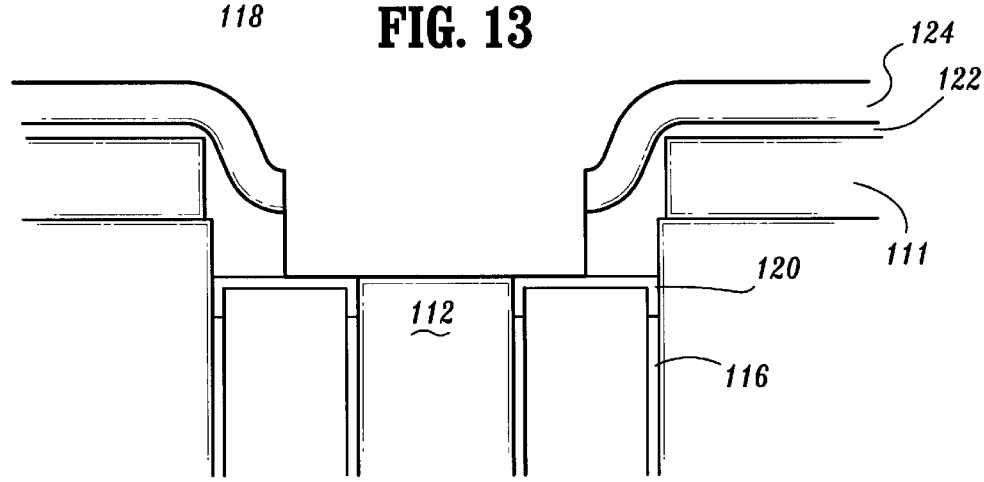
FIG. 14 is a cross-sectional view of the semiconductor chip of FIG. 13 showing the DARC and the dielectric layer patterned according to the resist layer in accordance with the present invention.
Figure 15:
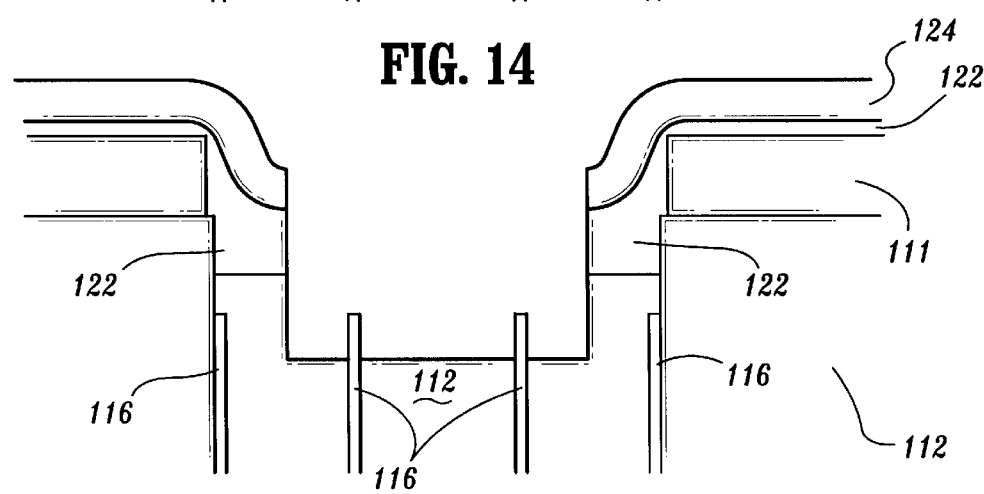
FIG. 15 is a cross-sectional view of the semiconductor chip of FIG. 14 showing the resist layer stripped and the DARC employed as a hard mask for etching a semiconductor device structure in accordance with the present invention.

Referring to FIG. 13, an inorganic dielectric layer 124 (or layer 24) may be employed as a hard mask for etching underlying layers. Resist layer 130 (or 30) is patterned and a portion of layer 122 (or layer 22) and layer 124 (or layer 24) is removed in accordance with the pattern as shown in FIG. 14. Resist layer 130 is then stripped. Now, a substrate etch (e.g., a silicon etch) is performed selective to layer 124 to achieve the structure as shown in FIG. 15. Prior art organic ARCs are difficult to employ as hard masks since the resist must be used to etch through pad nitride 111 and recess polysilicon of storage node 118. By employing layer 124 as a hard mask, contamination of carbon materials is reduced (e.g., no organic resist) and scalloping or roughening of active area sidewalls by the removal of organic resist is avoided. The end result is the a same as shown in FIG. 6 or 12.

The present invention provides a removable DARC process preferably using a structure which permits the use of DARC for critical front end of line (FEOL) applications. For example, applications for etching prior to metal line formation. Advantageously, the present invention provides a new and useful technique for employing inorganic DARCs including all of the beneficial characteristics without the difficulty of removing the inorganic DARC layer. The present invention provides an underlayer to the DARC which is easily removable. This is particular useful in application where the underlayer should be removed, for example, in AA etching processes. In addition, the superior conformality (e.g., greater than 70% sidewall coverage for vertically disposed surfaces) of DARC materials provides additional flexibility for use in semiconductor processing.

Having described preferred embodiments for a novel removable inorganic anti-reflection coating process (which are intended to be illustrative and not limiting), it is noted that modifications and variations can be made by persons skilled in the art in light, of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for etching an active area, comprising the steps of:
   providing a substrate having deep trenches formed therein and a pad stack formed thereon, the trenches including storage nodes and buried straps formed in the trenches;
   providing a first dielectric layer on the pad stack, on sidewalls of the trenches and over the buried straps, the first dielectric layer being selectively removable relative to the pad stack, the sidewalls of the trenches and the buried straps;
   forming an inorganic dielectric anti-reflection coating (DARC) on the first dielectric layer, the DARC being selectively removable relative to the first dielectric layer;
   patterning a resist layer on the DARC, the resist being selectively removable relative to the DARC;
   etching positions for shallow trench isolation regions in accordance with the patterned resist layer; and
   selectively removing the resist layer, the DARC and the first dielectric layer;
   wherein the first dielectric layer comprises a portion that forms an overhang structure on a sidewall of the trench to prevent at least some coverage of the sidewall by the DARC.

2. The method as recited in claim 1, wherein the step of providing a first dielectric layer includes the step of forming a conformal first dielectric layer.

3. The method as recited in claim 1, wherein the first dielectric layer includes a silicon oxide or a polymer.

4. The method as recited in claim 1, wherein the step of forming an inorganic dielectric anti-reflection coating (DARC) on the first dielectric layer includes the step of annealing the DARC to prevent interactions between the resist layer and the DARC.

5. The method as recited in claim 1, wherein the step of forming an inorganic dielectric anti-reflection coating (DARC) on the first dielectric layer includes the step of depositing the DARC by one of a chemical vapor deposition process and a physical vapor deposition process.

6. The method as recited in claim 1, wherein the step of forming an inorganic dielectric anti-reflection coating (DARC) on the first dielectric layer includes the step of forming the DARC with silicon oxynitride.

7. The method as recited in claim 1, further comprising the step of forming a second dielectric layer on the DARC, the second dielectric layer being selectively removable relative to the DARC.

8. The method as recited in claim 1, wherein the DARC layer covers at least about 60% of the sidewall.

9. A method for employing and removing inorganic anti-reflection coatings, comprising the steps of:
   providing a substrate having deep trenches formed thereon and a pad stack formed thereon, the trenches including storage nodes and buried straps formed in the trenches;
   providing a first dielectric layer on a semiconductor device structure to be processed, the first dielectric layer being selectively removable relative to the semiconductor device structure;
   forming an inorganic dielectric anti-reflection coating (DARC) on the first dielectric layer, the DARC being selectively removable relative to the first dielectric layer;
   patterning a resist layer on the DARC, the resist layer being selectively removable relative to the DARC;
   etching the semiconductor device structure; and
   selectively removing the resist layer, the DARC and the first dielectric layer;
   wherein the first dielectric layer comprises a portion that forms an overhang structure on a vertical surface of the semiconductor device to prevent at least some coverage of the vertical surface by the DARC.

10. The method as recited in claim 9, wherein the step of providing a first dielectric layer includes the step of forming a conformal first dielectric layer.

11. The method as recited in claim 9, wherein the first dielectric layer includes a silicon oxide or a polymer.

12. The method as recited in claim 9, wherein the step of forming an inorganic dielectric anti-reflection coating (DARC) on the first dielectric layer includes the step of forming the DARC including a silicon oxynitride.

13. The method as recited in claim 9, wherein the step of forming an inorganic dielectric anti-reflection coating (DARC) on the first dielectric layer includes the step of annealing the DARC to prevent interactions between the resist layer and the DARC.

14. The method as recited in claim 9, wherein the step of forming an inorganic dielectric anti-reflection coating (DARC) on the first dielectric layer includes the step of depositing the DARC by one of a chemical vapor deposition and a physical vapor deposition process.

15. The method as recited in claim 9, further comprising the step of forming a second dielectric layer on the DARC, the second dielectric layer being selectively removable relative to the DARC.

16. The method as recited in claim 9, wherein the DARC layer covers at least about 60% of the vertical surface.

17. A method for employing inorganic anti-reflection coatings, comprising the steps of:
   providing a substrate having deep trenches formed thereon and a pad stack formed thereon, the trenches including storage nodes and buried straps formed in the trenches;
   providing a first dielectric layer on a semiconductor device structure to be processed, the first dielectric layer being selectively removable relative to the semiconductor device structure;
   forming an inorganic dielectric anti-reflection coating (DARC) on the first dielectric layer, the DARC being selectively removable relative to the first dielectric layer;
   patterning a resist layer on the DARC, the resist layer being selectively removable relative to the DARC;
   etching a portion of the DARC and the first dielectric layer in accordance with the resist layer;
   selectively removing the resist layer with respect to the DARC; and
   etching the semiconductor device structure by employing the DARC as a hard mask.

18. The method as recited in claim 17, further comprising the step of selectively removing the DARC and the first dielectric layer.

19. The method as recited in claim 17, wherein the step of etching the semiconductor device structure by employing the DARC as a hard mask includes the step of removing a portion of the DARC during the etching of the semiconductor device structure.

20. The method as recited in claim 17, wherein the first dielectric layer includes a silicon oxide.

21. The method as recited in claim 17, wherein the step of forming an inorganic dielectric anti-reflection coating (DARC) on the first dielectric layer includes the step of annealing the DARC to prevent interactions between the resist layer and the DARC.

22. The method as recited in claim 17, wherein the step of forming an inorganic dielectric anti-reflection coating (DARC) on the first dielectric layer includes the step of forming the DARC with silicon oxynitride.

* * * * *